(12) United States Patent
Hui et al.

(10) Patent No.: US 6,583,009 B1
(45) Date of Patent: Jun. 24, 2003

(54) INNOVATIVE NARROW GATE FORMATION FOR FLOATING GATE FLASH TECHNOLOGY

(75) Inventors: Angela T. Hui, Fremont, CA (US); Kelwin Ko, San Jose, CA (US); Hiroyuki Kinoshita, Sunnyvale, CA (US); Sameer Haddad, San Jose, CA (US); Yu Sun, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/178,106

(22) Filed: Jun. 24, 2002

(51) Int. Cl.[7] ............................................. H01L 21/8247
(52) U.S. Cl. ....................................... 438/264; 438/952
(58) Field of Search ................................. 438/257–267, 438/952

(56) References Cited

U.S. PATENT DOCUMENTS

| 4,851,365 A | * | 7/1989 | Jeuch ........................... 438/257 |
| 5,120,571 A | * | 6/1992 | Gill et al. ...................... 438/262 |
| 5,517,443 A | | 5/1996 | Liu et al. |
| 5,942,787 A | * | 8/1999 | Gardner et al. .............. 257/408 |
| 6,130,129 A | | 10/2000 | Chen |
| 6,362,057 B1 | * | 3/2002 | Taylor et al. ................ 438/286 |

* cited by examiner

*Primary Examiner*—Richard Booth
(74) *Attorney, Agent, or Firm*—Eschweiler & Associates, LLC

(57) ABSTRACT

The present invention relates to a method of forming a stacked gate flash memory cell and comprises forming a tunnel oxide layer, a first conductive layer, an interpoly dielectric layer, and a second conductive layer in succession over a semiconductor substrate. The method further comprises forming a sacrificial layer over the second conductive layer, and patterning the sacrificial layer to form a sacrificial layer feature having at least one lateral sidewall edge associated therewith. A sidewall spacer is then formed against the lateral sidewall edge of the sacrificial layer, wherein the spacer has a width associated therewith, and the patterned sacrificial layer feature is removed. Finally, the second conductive layer, the interpoly dielectric and the first conductive layer are patterned using the spacer as a hard mask, and defining the stacked gate, wherein a width of the stacked gate is a function of the spacer width.

4 Claims, 12 Drawing Sheets

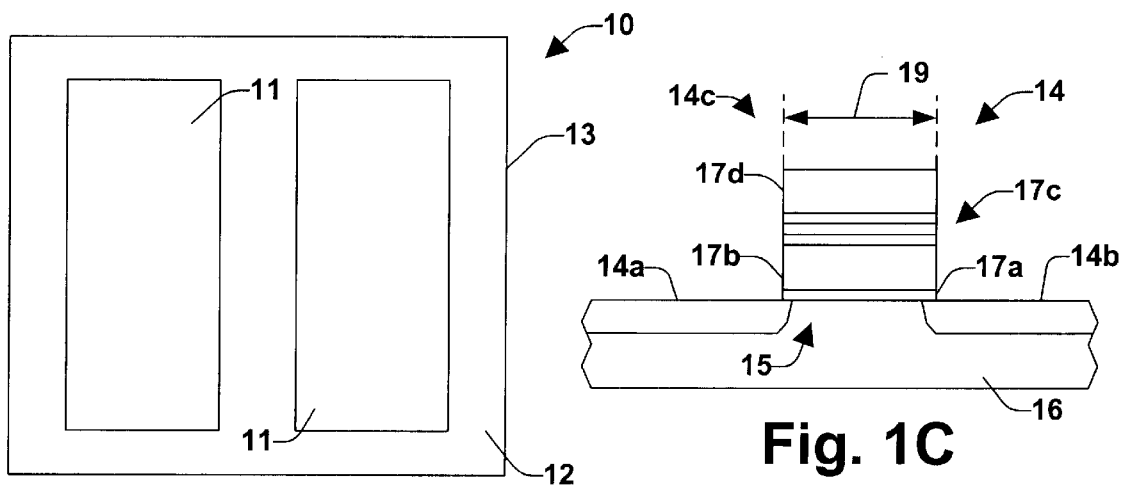
Fig. 1A
(PRIOR ART)
Fig. 1C
(PRIOR ART)
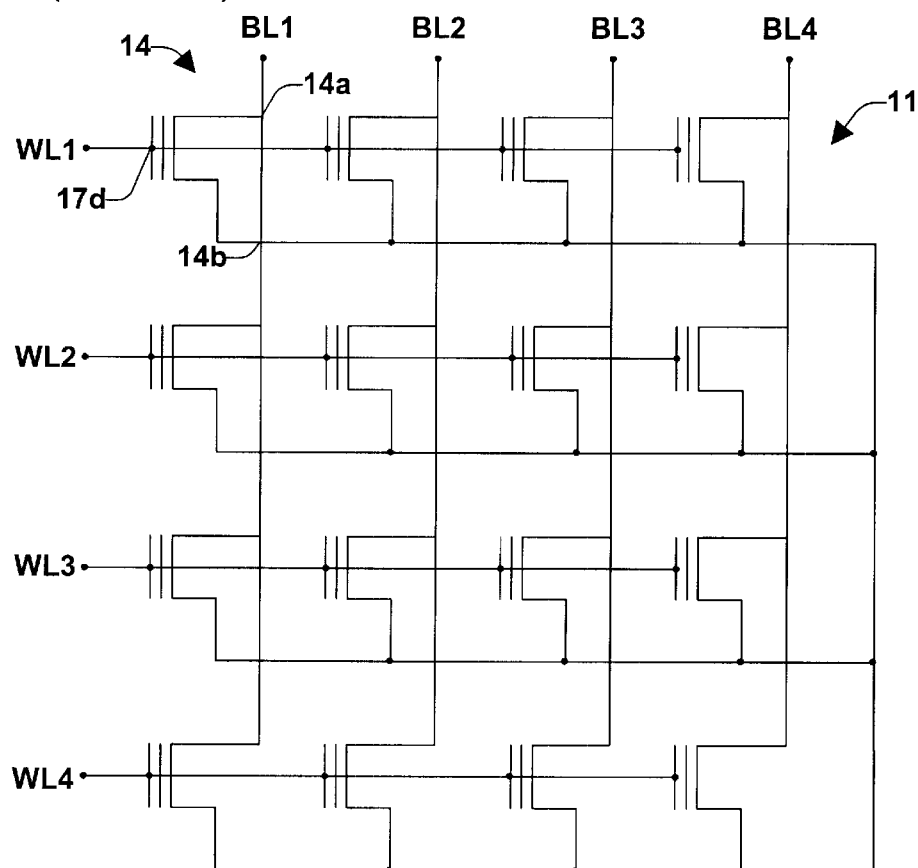
Fig. 1B
(PRIOR ART)

INNOVATIVE NARROW GATE FORMATION FOR FLOATING GATE FLASH TECHNOLOGY

FIELD OF THE INVENTION

The present invention generally relates to stacked gate memory devices such as an array of flash memory cells, and relates more particularly to a method of forming a stacked gate flash memory cell having a feature dimension which may be less than a feature dimension capable of being formed using conventional lithography processes.

BACKGROUND OF THE INVENTION

As is generally known, in recent years a new category of electrically erasable EPROMs/EEPROMs has emerged as an important non-volatile memory which combines the advantages of EPROM density with EEPROM electrical erasability and are sometimes referred to as "flash" EPROM or EEPROM. Flash memory devices typically include multiple individual components formed on or within a substrate. Such devices often comprise a high density section and a low density section. For example, as illustrated in prior art FIG. 1A, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 11 are coupled together in a NOR-type circuit configuration, such as, for example, the configuration illustrated in prior art FIG. 1B. Each memory cell 14 has a drain 14a, a source 14b and a stacked gate 14c.

The NOR configuration illustrated in FIG. 1B has each drain terminal 14a of the transistors within a single column connected to the same bit line (BL). In addition, each flash cell 14 has its stacked gate terminal 14c coupled to a different word line (WL) while all the flash cells in the array have their source terminals 14b coupled to a common source terminal (CS). In operation, individual flash cells may be individually addressed via the respective bit line and word line using peripheral decoder and control circuitry for programming (writing), reading or erasing functions.

Prior art FIG. 1C represents a fragmentary cross section diagram of a typical memory cell 14 in the core region 11 of prior art FIGS. 1A and 1B. Such a cell 14 typically includes the source 14b, the drain 14a, and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, e.g., prior art FIG. 1B). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

According to conventional operation, the flash memory cell 14 operates in the following manner. The cell 14 is programmed by applying a relatively high voltage $V_G$ (e.g., approximately 9 volts) to the control gate 17d and connecting the source to ground and the drain 14a to a predetermined potential above the source 14b (e.g., approximately 5 volts). These voltages generate a vertical and lateral electric field along the length of the channel from the source to the drain. This electric field causes electrons to be drawn off the source and begin accelerating toward the drain. As they move along the length of the channel, they gain energy. If they gain enough energy, they are able to jump over the potential barrier of the oxide into the floating gate 17b and become trapped in the floating gate 17b since the floating gate 17b is surrounded by insulators (the interpoly dielectric 17c and the tunnel oxide 17a). As a result of the trapped electrons, the threshold voltage of the cell 14 increases, for example, by about 2 to 5 volts. This change in the threshold voltage (and thereby the channel conductance) of the cell 14 created by the trapped electrons is what causes the cell to be programmed.

To read the memory cell 14, a predetermined voltage $V_G$ that is greater than the threshold voltage of an unprogrammed or erased cell, but less than the threshold voltage of a programmed cell, is applied to the control gate 17d with a voltage applied between the source 14b and the drain 14a (e.g., tying the source 14b to ground and applying about 12 volts to the drain 14a). If the cell 14 conducts (e.g., about 50–100 $\mu$A), then the cell 14 has not been programmed (the cell 14 is therefore at a first logic state, e.g., a zero "0"). Likewise, if the cell 14 does not conduct (e.g., considerably less current than 50–100 $\mu$A), then the cell 14 has been programmed (the cell 14 is therefore at a second logic state, e.g., a one "1"). Consequently, one can read each cell 14 to determine whether it has been programmed (and therefore identify its logic state).

A flash memory cell 14 can be erased in a number of ways. In one arrangement, a relatively high voltage VS (e.g., approximately 12–20 volts) is applied to the source 14b and the control gate 17d is held at a ground potential ($V_G=0$), while the drain 14a is allowed to float. Under these conditions, a strong electric field is developed across the tunnel oxide 17a between the floating gate 17b and the source 14b. The electrons that are trapped in the floating gate undergo Fowler-Nordheim tunneling through the tunnel oxide 17a to the source 14b. In another arrangement, applying a negative voltage on the order of minus 10 volts to the control gate, applying 5 volts to the source and allowing the drain to float can also erase a cell. In a further arrangement, applying 5 volts to the P-well and minus 10 volts to the control gate while allowing the source and drain to float erases a cell.

In order to reduce memory costs, designers are constantly seeking ways to reduce a size of an individual flash memory cell in order to increase the memory density and therefore decrease the unit cost per bit. Unfortunately, a size of a flash memory cell is often limited by the lithography capabilities of the manufacturing process. For example, as illustrated in FIG. 1C, a width 19 of the stacked gate cell is limited by the lithography resolution of the stepper system. For example, in present day manufacturing processes, a feature dimension can be produced reliably at a feature size of about 0.13 micron. In order to further reduce cell size and therefore increase memory density and decrease the unit cost per bit, it would be desirable to create a memory cell having a width that is less than the capability of present day lithography processes, for example, of a dimension of about 100 nm (0.10 micron) or less.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The present invention relates to a method of forming a stacked gate flash memory cell. The width of the flash memory cell is reduced to dimensions which are less than the feature resolution of lithography systems by employing a sidewall spacer as a hard mask to pattern the flash memory cell stack.

In accordance with one aspect of the present invention, a memory cell layer stack is formed by successive formation of a tunnel oxide layer, a first conductive layer, an interpoly dielectric layer and a second conductive layer, respectively. A sacrificial layer is then formed over the second conductive layer, and the sacrificial layer is patterned to form a sacrificial layer feature having a lateral sidewall edge associated therewith. A sidewall spacer is then formed adjacent the lateral sidewall edge, and the sidewall spacer is then employed as a hard mask to pattern the memory cell layer stack to form a stacked gate flash memory cell, wherein a width associated therewith is a function of the spacer width.

In accordance with another aspect of the present invention, the formation of the sacrificial layer comprises forming a dummy oxide layer over the second conductive layer followed by the formation of an antireflective coating thereover, for example, a nitride type layer. The patterning of the sacrificial layer then comprises patterning the antireflective coating to form a feature having a lateral edge sidewall. The sidewall spacer is then formed adjacent the lateral edge sidewall of the antireflective coating feature by depositing a spacer material thereover and performing a generally anisotropic etch thereof, thereby substantially removing the spacer material overlying the dummy oxide and a top portion of the antireflective coating feature, and leaving spacer material adjacent the sidewall edge. The antireflective coating feature is then removed, leaving the sidewall spacer overlying the dummy oxide layer. The sidewall spacer is then employed to pattern the dummy oxide material, and the sidewall spacer and patterned dummy oxide together act as a hard mask in the subsequent patterning of the memory cell stack.

In accordance with still another aspect of the present invention, a method of patterning a stacked gate flash memory cell comprises successively forming a tunnel oxide, a first polysilicon layer (a poly1 of floating gate layer), an oxide-nitride-oxide (ONO) layer, and a second polysilicon layer (a poly2 or control gate layer) to form a memory cell layer stack. A dummy oxide material (or other material substantially selective with respect to underlying layers in an etch process of the stack) is formed thereover, followed by the formation of an antireflective coating such as a nitride material.

The antireflective coating is subsequently patterned, for example, via a standard patterned photoresist, wherein the antireflective coating minimizes standing wave phenomena due to exposure reflections, to formed a patterned antireflective coating having a lateral sidewall edge and a feature size which is as small as the lithography system permits. A spacer layer, such as a polysilicon layer, is then formed over the patterned antireflective coating and etched in a generally anisotropic manner to form a poly sidewall spacer adjacent the lateral sidewall edge of the patterned antireflective coating. The width of the poly sidewall spacer is a function of a thickness of the deposited polysilicon layer over the antireflective coating and may be less than a feature width capability of the lithography system (e.g., 100 nm or less). The patterned antireflective coating is removed, and the dummy oxide material is patterned using the poly spacer as a hard mask. The poly2 layer is then etched using both the poly spacer and the patterned dummy oxide as a hard mask (wherein the poly2 patterning substantially deteriorates or removes the poly spacer). The patterned dummy oxide is then employed to complete the patterning of the ONO and poly1 layer to fabricate a stacked gate flash memory cell having a width which is a function of the poly spacer width, which may be less than a feature size capability of the lithography system.

In accordance with yet another aspect of the present invention, a patterning of any type feature having a feature size less than a capability of a lithography system is provided. The method comprises forming a first layer over a substrate, and forming a second layer over the first layer. The second layer is patterned, for example, using conventional lithography to form a structure having a sidewall edge associated therewith and a third layer is formed over the patterned structure. The third layer is patterned, for example, using a generally anisotropic etch to form a sidewall spacer adjacent the sidewall edge of the second layer, and the patterned second layer structure is removed, leaving the sidewall spacer having a width associated therewith. The width of the sidewall spacer is a function of the thickness of the third (spacer) layer when formed, and may be less than a minimum feature size capability of a lithography system. The first layer is then patterned using the sidewall spacer as a hard mask to thereby form a first layer feature having a feature size which is a function of the sidewall spacer.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1a is a plan view of a conventional flash memory device illustrating core regions and peripheral regions, respectively;

FIG. 1b is a schematic diagram illustrating a conventional NOR-type flash memory circuit architecture;

FIG. 1c is a cross section diagram illustrating a conventional stacked gate flash memory cell;

DETAILED DESCRIPTION OF THE INVENTION

Figure 2A:
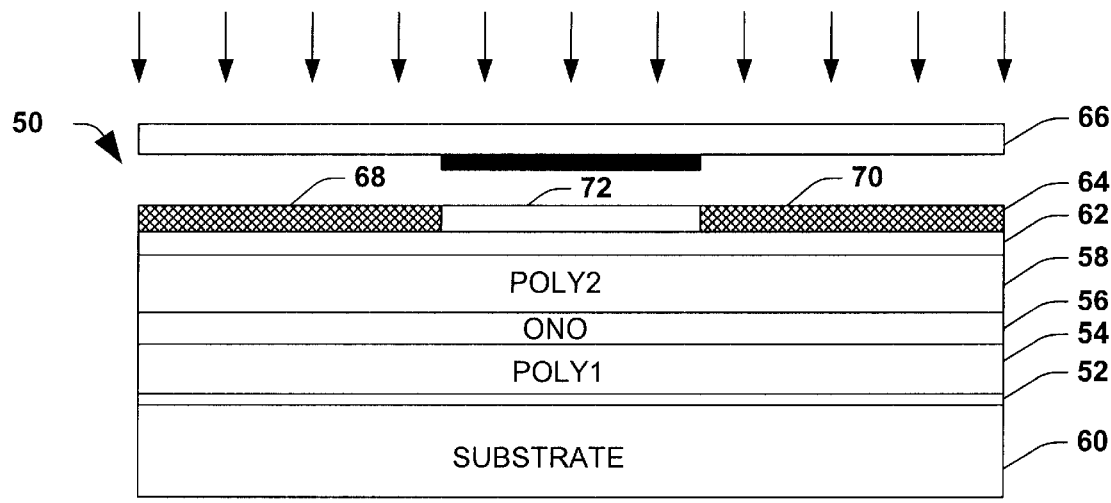
FIGS. 2A–2C are cross section diagrams illustrating a manner in which a stacked gate flash memory cell is conventionally formed and how a critical dimension associated therewith is a function of lithography capability.

The present invention will now be described with reference to the drawings, wherein like reference numerals are used to refer to like elements throughout.

The present invention provides a method of forming a stacked gate flash memory cell having a cell width which is less than a minimum feature size capability of present day lithography systems. The present invention obtains the reduced stacked gate flash cell feature size by forming a sidewall spacer over the flash memory layer stack, wherein the sidewall spacer has a thickness which is a function of the layer employed to form the spacer, and such thickness may be smaller than the lithography capabilities (e.g., about 100 nm or less).

Figure 2B:
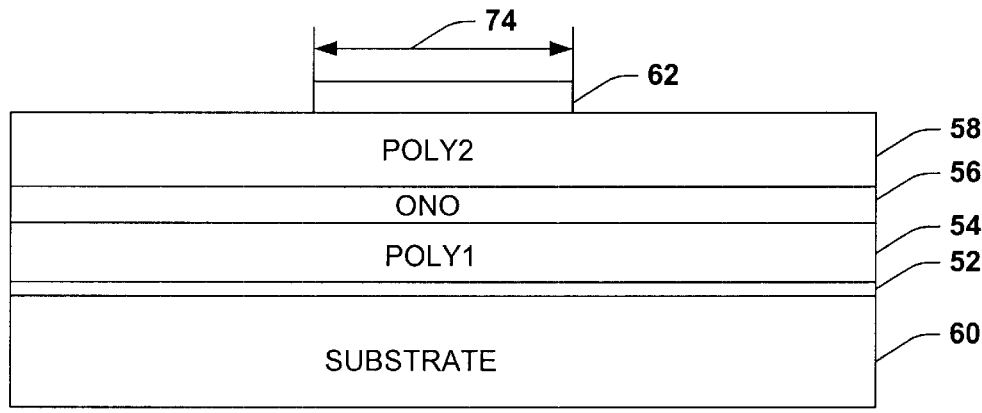
Figure 2C:
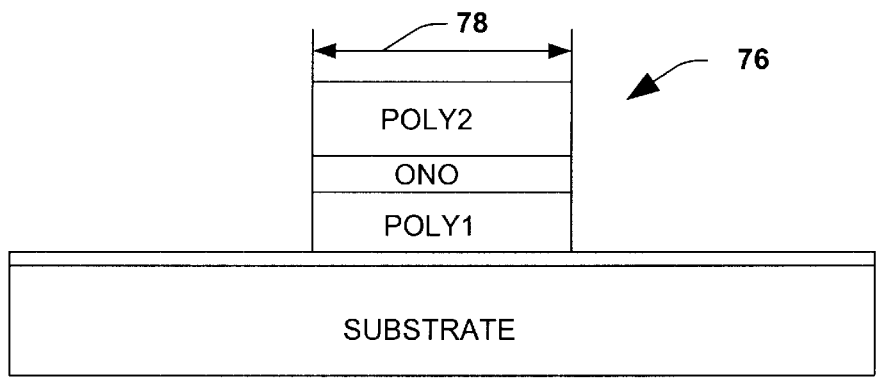

In order to fully appreciate the differences between the present invention and the prior art, a brief, exemplary discussion of the formation of a conventional stacked gate flash memory cell follows below. Turning to prior art FIG. 2A, a flash memory stack 50 is formed wherein a tunnel oxide 52, a poly1 layer 54, an ONO layer 56 and a poly2 layer 58 are formed successively over a semiconductor substrate 60. A hard mask material 62 is formed thereover, followed by a photoresist layer 64, which is then patterned by exposure thereof via a photomask 66, resulting in exposed portions 68 and 70, respectively. After development of the photoresist 64, an unexposed photoresist portion 72 remains which is utilized to pattern the underlying hard mask 62, as illustrated in prior art FIG. 2B.

Due to the lithography capabilities of the lithography system utilized to expose the photoresist layer 64, the hard mask feature size or width 74 is limited. That is, the width thereof can not be made infinitesimally small, but rather is limited in present day lithography systems to about 0.13–0.18 micron. The patterned hard mask 62 is then employed to pattern the flash memory stack 50 to generate a stacked gate memory cell 76 having a width 78 which is approximately that of the hard mask 62. That is, the width 78 of the stacked gate flash memory cell 76 is limited by the lithography capabilities of the lithography system used to fabricate the hard mask used in the stacked gate etch. As will be seen in the discussion below, the present invention overcomes the limitations of the prior art, thereby providing for stacked gate flash memory cells having a width or feature size which is less than present day lithography system capabilities.

Figure 3:
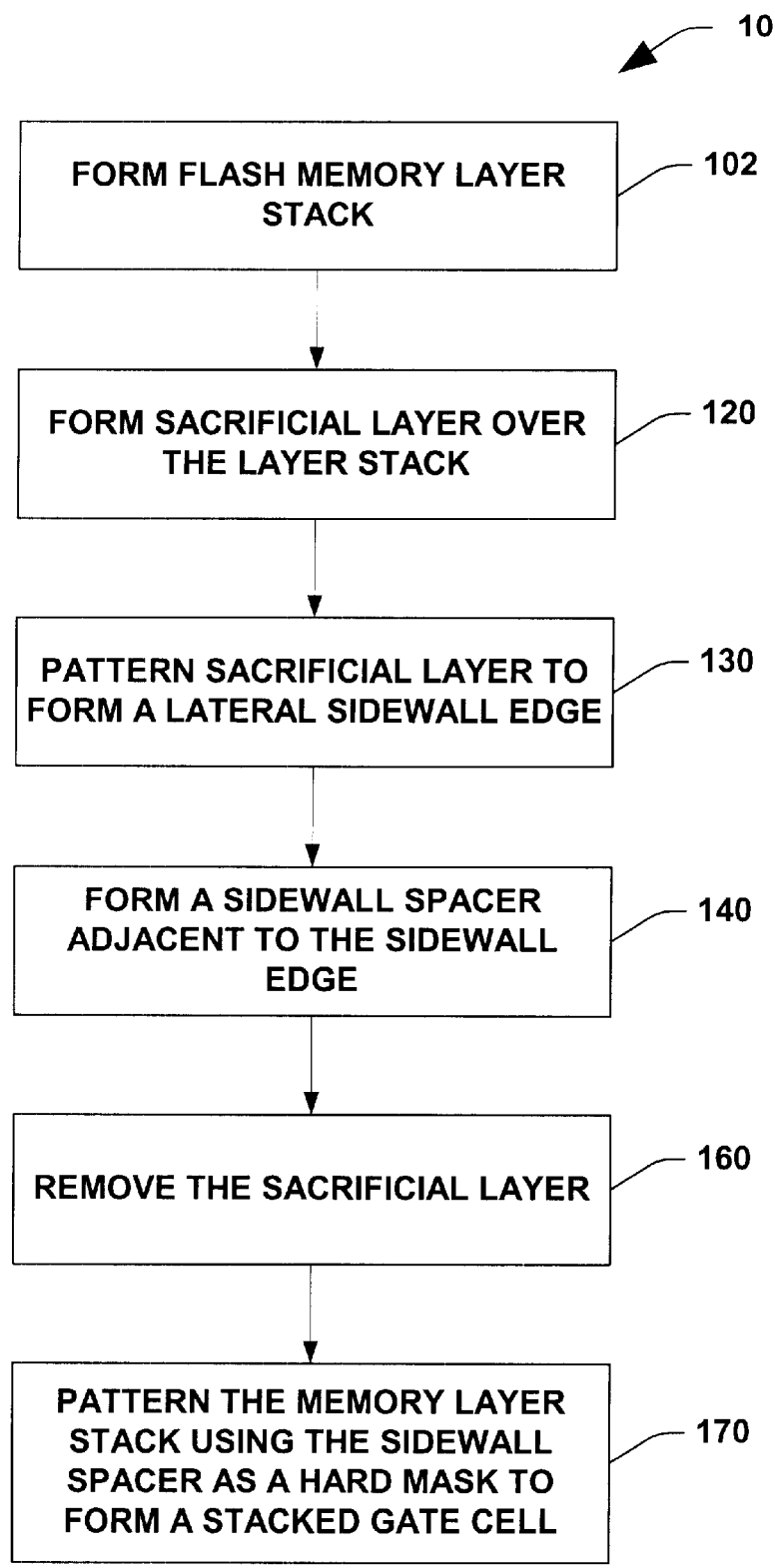
FIG. 3 is a flow chart diagram illustrating a method of forming a stacked gate flash memory cell which may have a feature size which is less than a capability of a lithography system in accordance with one exemplary aspect of the present invention.

Turning now to FIG. 3, a method 100 of forming a stacked gate flash memory cell is disclosed in accordance with one exemplary aspect of the present invention. Although the method 100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated acts or events may be required to implement a methodology in accordance with the present invention. Furthermore, the methods according to the present invention may be implemented in association with the formation and/or processing of structures illustrated and described herein as well as in association with other structures not illustrated.

Figure 4:
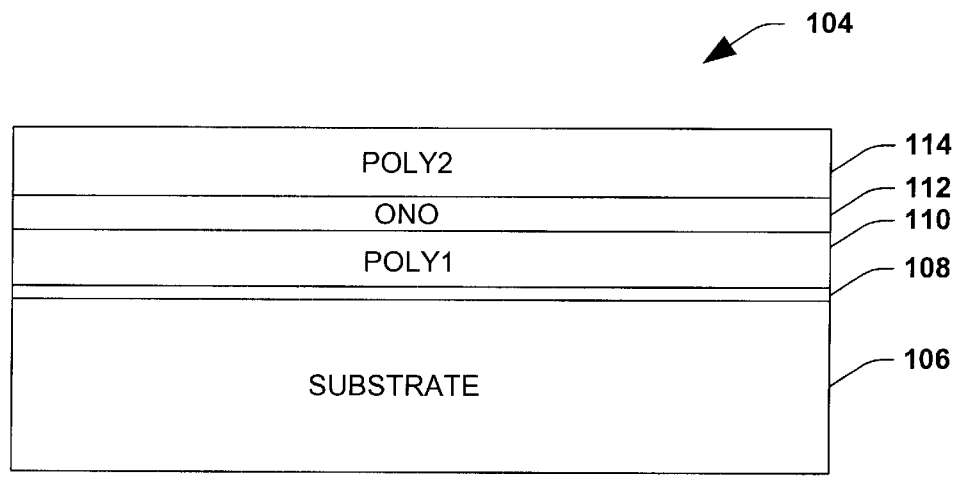
FIG. 4 is a cross section diagram illustrating a stacked gate flash memory layer stack in accordance with the present invention.

The method 100 begins at 102, wherein a flash memory layer stack is formed. For example, as illustrated in FIG. 4, a flash memory stack 104 overlies a semiconductor substrate 106, and comprises a tunnel oxide layer 108, a first conductive layer 110 (e.g., a polysilicon (poly1) layer), an interpoly dielectric layer 112 (e.g., an oxide-nitride-oxide (ONO) layer), and a second conductive layer 114 (e.g., a polysilicon (poly2) layer), which are formed in successive fashion. Such layers may be formed via conventional formation processes, for example, thermal oxidation, chemical vapor deposition (CVD), and the like. Any manner of forming such layers to form a flash memory stack 104 may be employed and such formation processes are contemplated as falling within the scope of the present invention.

Figure 5:
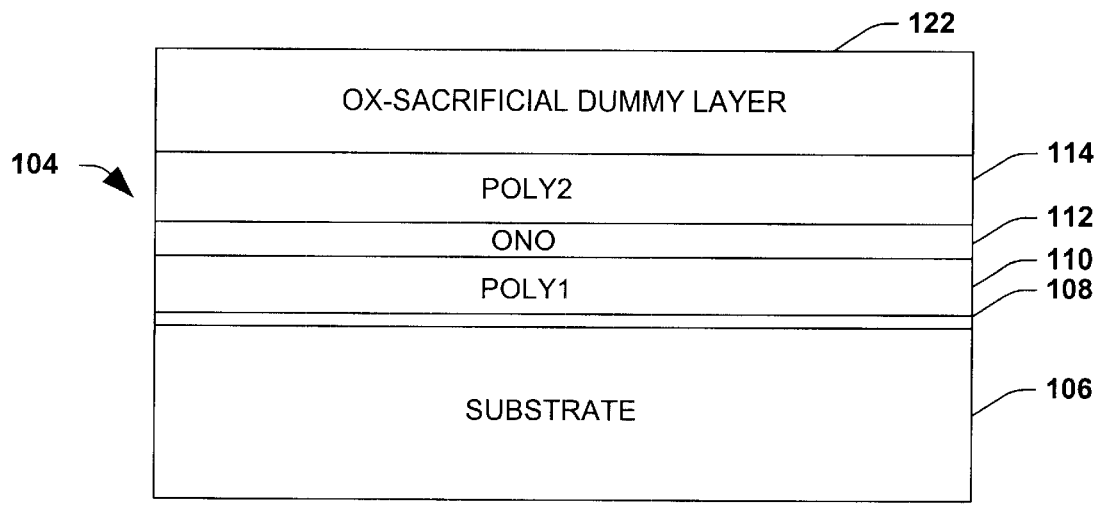
FIG. 5 is a cross section diagram illustrating a sacrificial dummy layer formed over the memory layer stack in accordance with the present invention.
Figure 6:
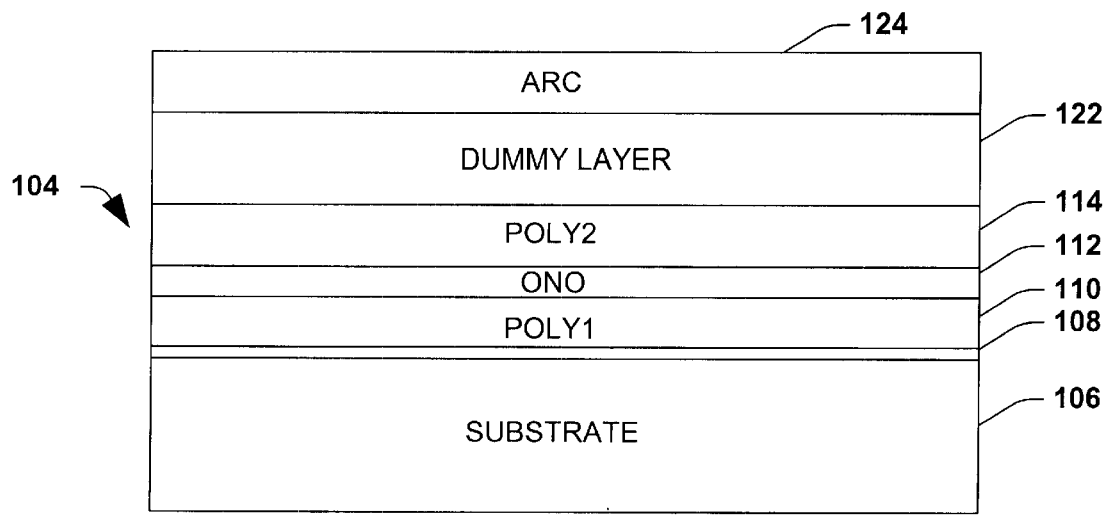
FIG. 6 is a cross section diagram illustrating an antireflective coating layer formed over the sacrificial dummy layer in accordance with the present invention.

The method 100 continues at 120 with the formation of a sacrificial layer over the flash memory layer stack 104. For example, as illustrated in FIGS. 5 and 6, the formation of a sacrificial layer comprises forming a dummy oxide layer 122 over the layer stack 104 (FIG. 5) followed by an antireflective coating layer 124 (FIG. 6). In the present example, as will be appreciated by the following discussion, the sacrificial layer formation 120 comprises two layers, however, the formation of a single layer may be performed and such an alternative is contemplated as falling within the scope of the present invention.

Figure 7:
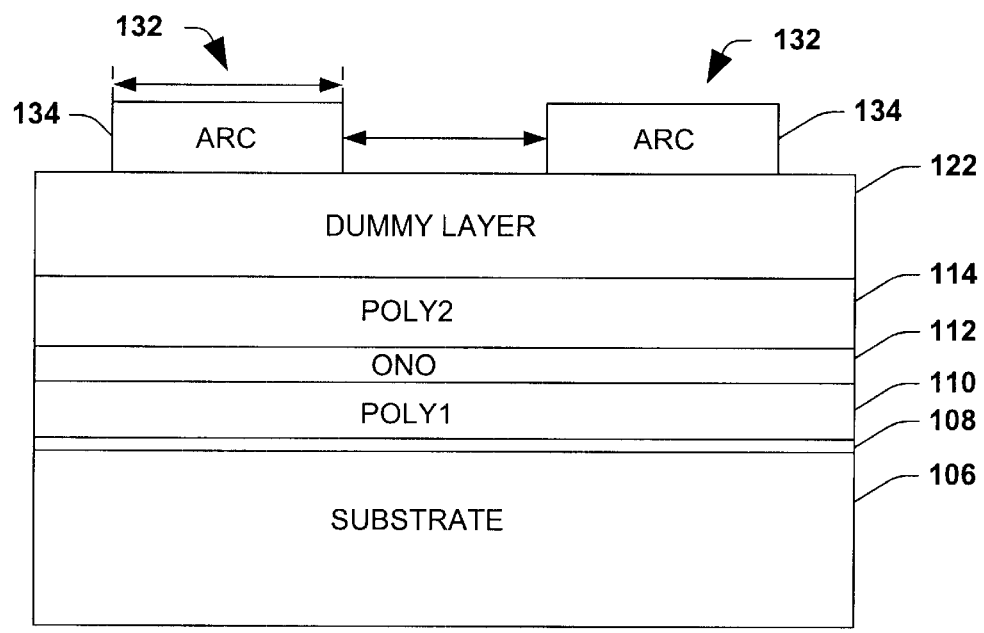
FIG. 7 is a cross section diagram illustrating a patterning of the antireflective coating layer in accordance with the present invention.

The method 100 of FIG. 3 continues at 130 with the patterning of the sacrificial layer to form a lateral sidewall edge. For example, as illustrated in FIG. 7, the antireflective film 124 portion of the sacrificial layer is patterned using a patterned photoresist (not shown) in a conventional manner to form one or more features 132. As illustrated in FIG. 7, at least one of the features has a lateral sidewall edge 134 associated therewith. In the present example, use of the antireflective film 124 is advantageous because since the resulting feature(s) 132 are formed via conventional lithography, the antireflective coating prevents substantial reflection of exposure radiation, thereby substantially preventing standing wave phenomena associated with radiation reflections, thereby allowing the resulting feature(s) 132 to be as small as the lithography system permits. Exemplary antireflective coating materials comprise SiN or SiON, however, any nitride material or other equivalent type materials structurally or functionally may be employed and such alternatives are contemplated as falling within the scope of the present invention.

Figure 8:
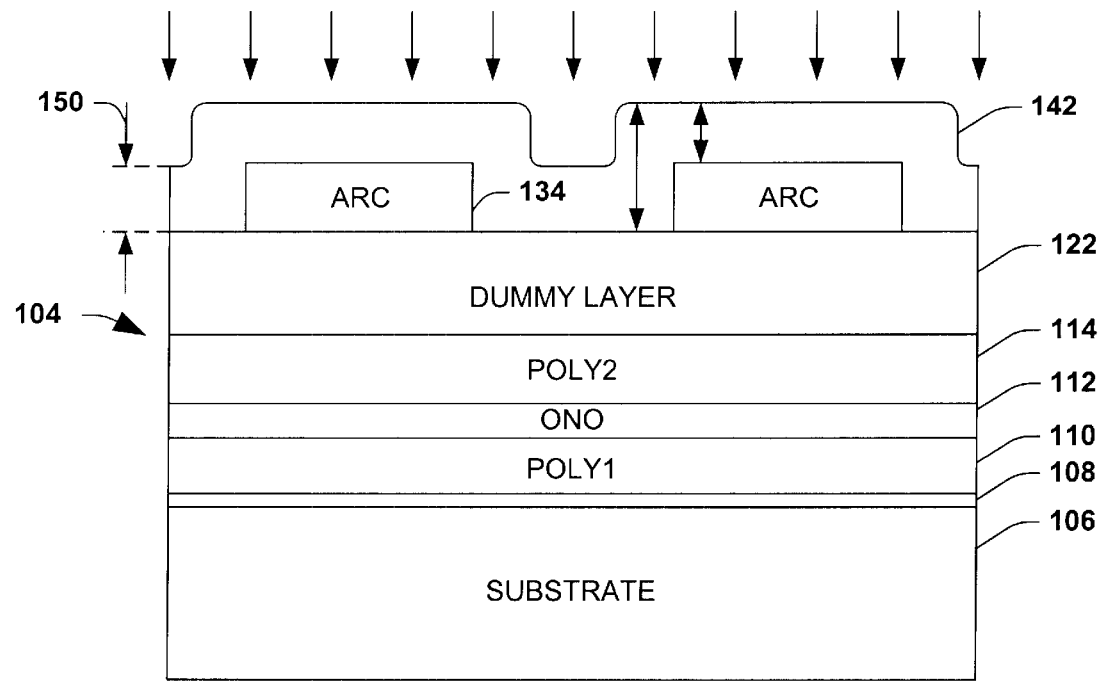
FIG. 8 is a cross section diagram illustrating a spacer layer formed over the patterned antireflective coating structure(s) in accordance with the present invention.
Figure 9:
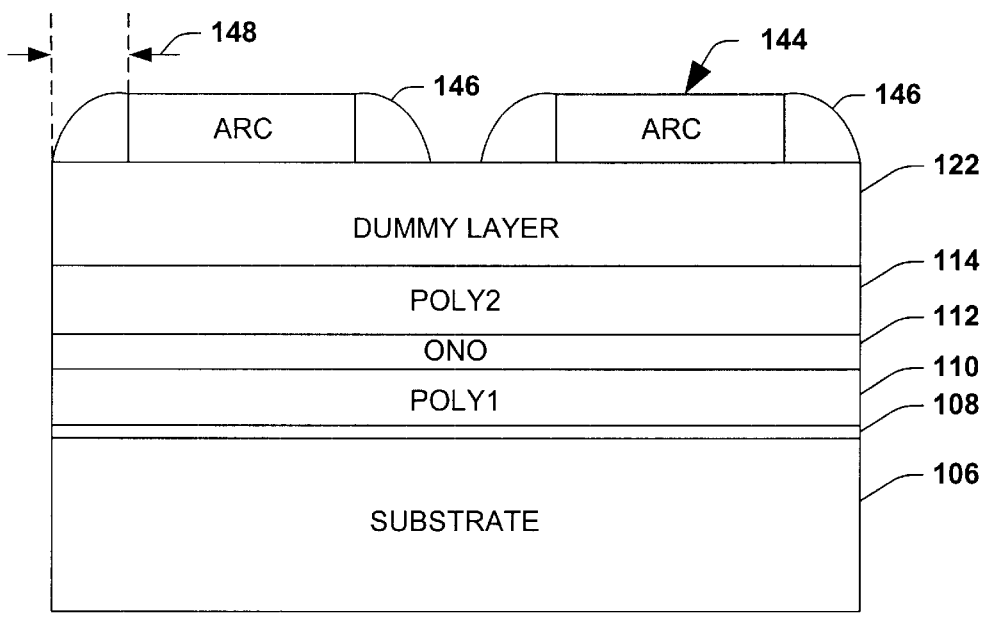
FIG. 9 is a cross section diagram illustrating the spacer layer after patterning thereof, resulting in one or more sidewall spacers located adjacent lateral sidewall edges of the patterned antireflective coating structures in accordance with the present invention.

Returning to FIG. 3, the method 100 continues at 140 with the formation of a sidewall spacer adjacent to the sidewall edge of the patterned sacrificial layer 132. For example, as illustrated in FIGS. 8 and 9, the spacer may be formed by depositing a spacer material layer 142 such as polysilicon over the patterned sacrificial layer (the features 132, FIG. 8) in a generally conformal manner. The spacer material layer 142 is deposited, for example, via CVD or other deposition processes, and then is patterned, for example, using a generally anisotropic dry etch. Because the spacer layer 142 is thicker along the sidewall edge(s) 134 of the features 132 (see arrows in FIG. 8), a patterning of the layer 142 results in the spacer material being removed over the oxide layer 122 and over a top portion 144 of the antireflective coating features 132, with a portion 146 of spacer material remaining adjacent to the sidewall edge of 134 of the feature(s) 132.

As can be appreciated by FIGS. 8 and 9, a width 148 of the spacer(s) 146 is a function of a thickness 150 of the spacer material layer 142 formed over the device. That is, as the thickness 150 of the spacer layer 142 is reduced, the width 148 of the resulting spacer 146 formed thereby is also reduced. As can be appreciated by layer formation processes, the thickness 150 of the spacer layer can be made sufficiently thin to enable the resulting spacer width 148 to be less than a feature size capability of present day lithography systems. Further, by tailoring the thickness of the spacer material layer 142 during deposition, one can readily control a resulting critical dimension of the stacked gate structure, as will be discussed in greater detail below.

Figure 10:
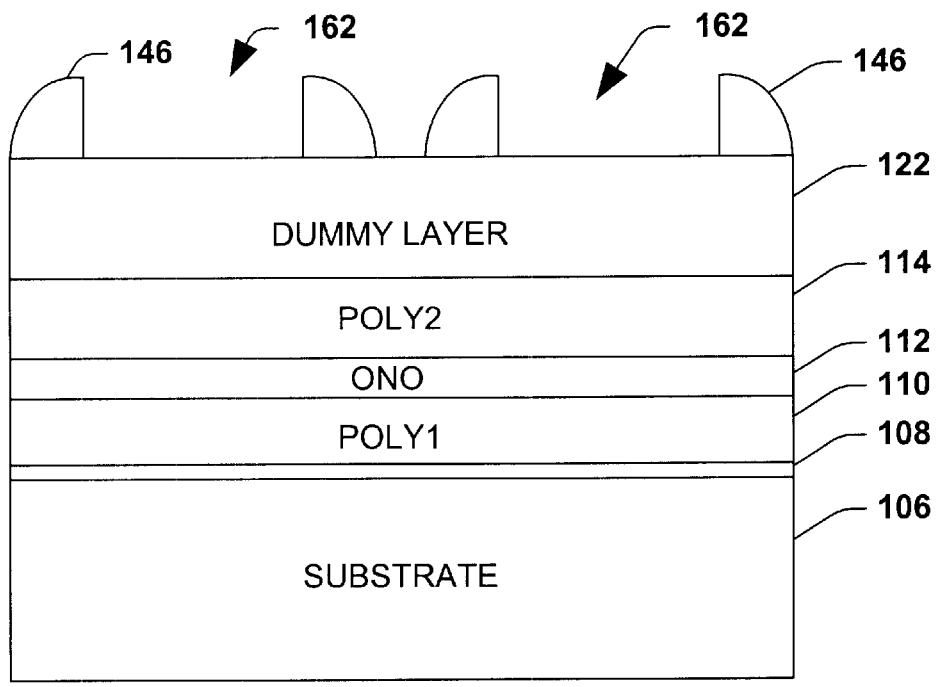
FIG. 10 is a cross section diagram illustrating the remaining sidewall spacers overlying the sacrificial layer after the removal of the antireflective coating structures in accordance with the present invention.

The method 100 of FIG. 3 further continues at 160 with the removal of the antireflective coating features 132 using, for example, a wet or dry etch, as illustrated in FIG. 9. The removal of the features 132 leaves spaces 162 remaining between the spacers 146, exposing the underlying oxide layer 122 therebetween. The spacers 146 are then used as a hard mask in subsequent patterning (170 of FIG. 3). For example, as illustrated in FIG. 10, the polysilicon spacer 146 is highly selective with respect to the underlying oxide layer 122. Therefore the patterning of the oxide layer 122 to form oxide regions 172 does not cause a substantial amount of degradation of the polysilicon. Note that use of polysilicon as the spacer material in the above example is advantageous because it is selective with respect to both the antireflective coating material 132 and the underlying oxide 122 and because processes for depositing or otherwise forming polysilicon layers are well established. However, any spacer material that is also substantially selective with respect to underlying materials may also be employed and such spacer materials are contemplated as falling within the scope of the present invention.

Figure 11:
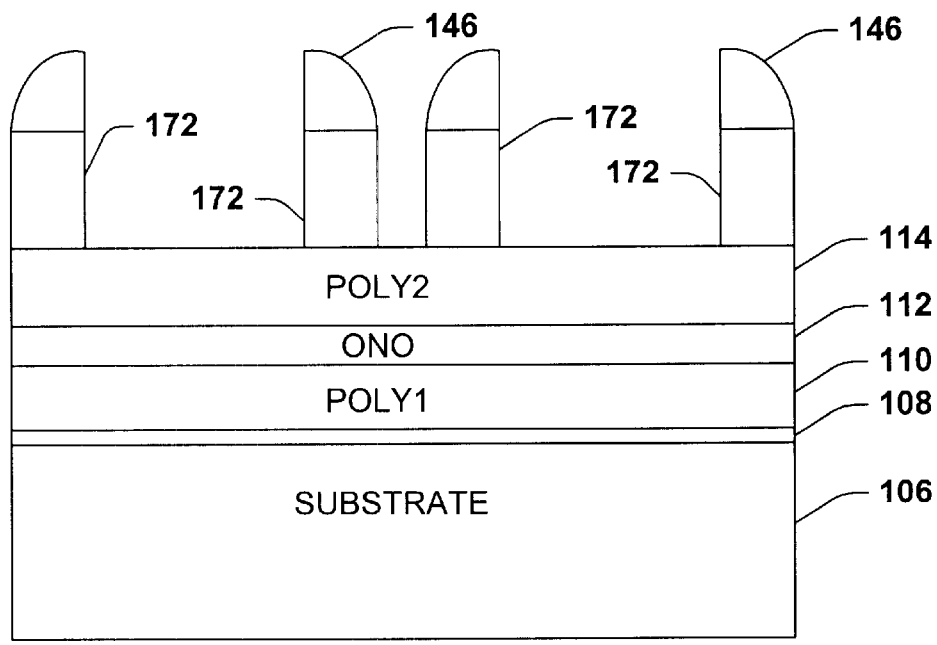
FIG. 11 is a cross section diagram illustrating a patterning of the sacrificial layer using the sidewall spacers as a hard mask in accordance with the present invention.
Figure 12:
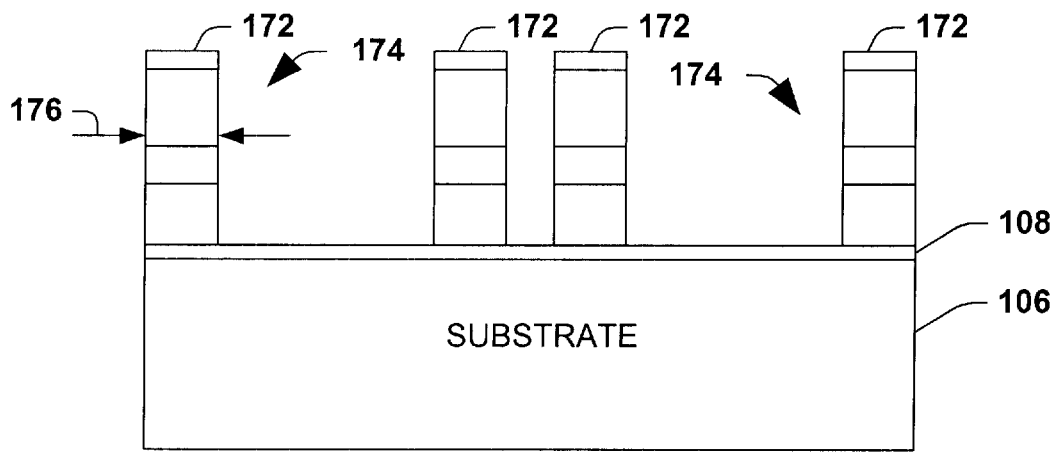
FIG. 12 is a cross section diagram illustrating a patterning of the memory layer stack using the sidewall spacer and the patterned sacrificial layer structures as hard mask to form a plurality of stacked gate flash memory structures in accordance with the present invention.

The patterning 170 continues, as illustrated in FIG. 11, wherein the memory layer stack 104 is patterned using the poly spacer 146 and underlying patterned oxide region(s) 172 as a hard mask. Since the first layer to be patterned in the memory layer stack 104 is typically a polysilicon layer (a poly2 control gate layer), the poly spacer 146 is severely deteriorated or removed altogether during such patterning, and the oxide region(s) 172 continue to serve as the hard mask for the subsequent patterning of the interpoly dielectric and first conductive layer, respectively, to thereby complete a formation of a stacked gate cell 174. Note that as the stacked gate(s) is patterned, the remaining oxide hard mask 172 substantially deteriorates, but its initial thickness is enough to ensure that the second conductive layer thereunder is not damaged substantially in the stack etch.

Note in FIGS. 9–12 that the width 148 of the spacer substantially dictates a width 176 of the resulting stacked gate cell structure 174. Further, since the spacer width 148 can be made smaller than a minimum feature size of present day lithography systems, the resulting stacked gate cell structure 174 exhibits a width or feature size 176 that is less than what could be achieved with a lithography process. For example, the width 176 of the stacked gate cell structure can be made about 100 nm (0.1 micron) or less.

Figure 13:
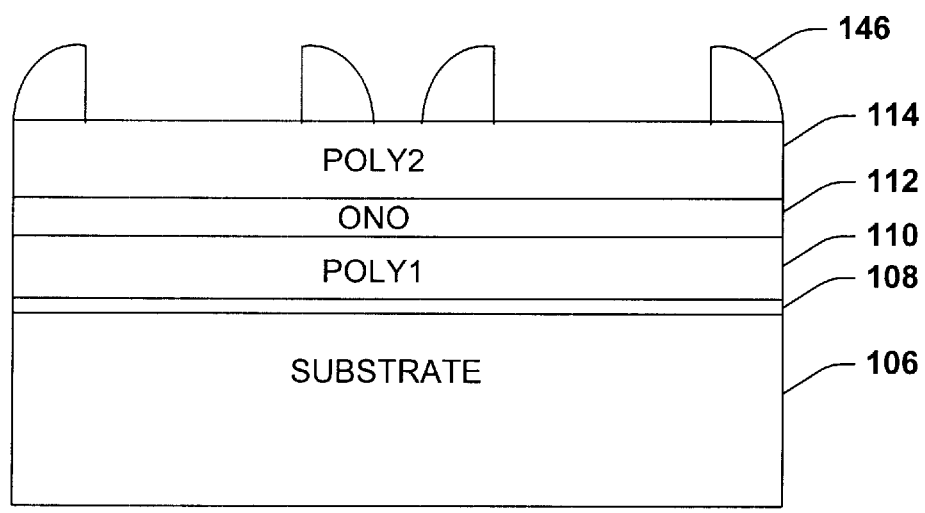
FIG. 13 is a cross section diagram illustrating the formation of sidewall spacers directly over the memory layer stack without use of an intervening sacrificial layer in accordance with another aspect of the present invention.

In accordance with another aspect of the present invention, a spacer is formed directly on a top portion (for example, the second conductive layer) of the memory layer stack without use of a sacrificial layer. For example, as illustrated in FIG. 13, the antireflective coating (or other suitable material) may be formed and patterned on the memory layer stack 104 and a spacer is formed adjacent to a lateral sidewall edge of the patterned feature. For example, as discussed above, a layer may be formed over the patterned feature in a generally conformal manner and then etched using a generally anisotropic type etch to form the spacer. Upon removing the patterned feature, the spacer may then be employed as a hard mask to pattern the memory layer stack 104 to form the stacked gate cell structure. Note that in the above example, the spacer is most likely not formed of polysilicon since it will not be sufficiently selective with respect to materials within the memory layer stack 104 during patterning thereof. However, the spacer may be formed of any suitable material, and if suitably selective, may be employed as a hard mask, wherein a width thereof is a function of a thickness of the spacer material during its deposition (which may be less than a lithography capability of present day lithographic systems).

Figure 15:
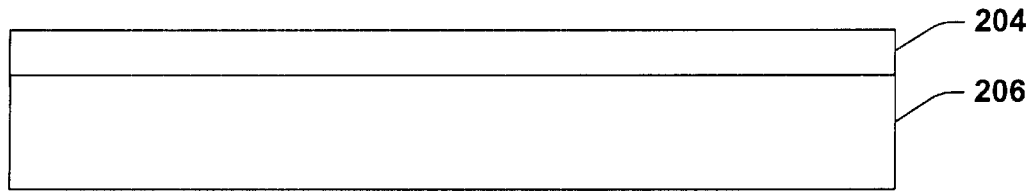
FIGS. 15 and 16 are cross section diagrams illustrating the formation of a first and second layer over a semiconductor substrate in accordance with the present invention.
Figure 16:
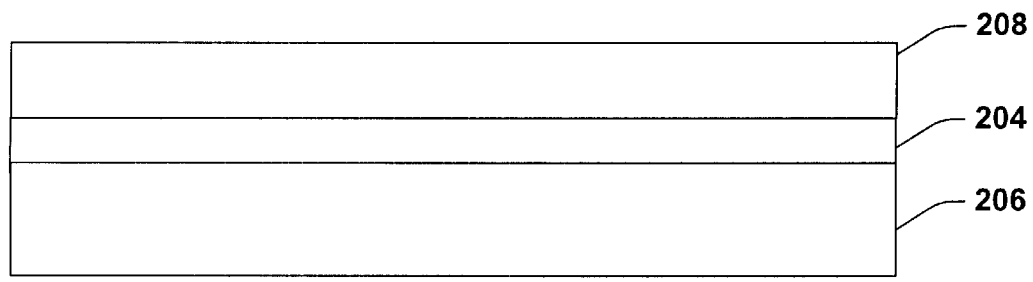

In accordance with yet another aspect of the present invention, the general principles discussed above in conjunction with the formation of a stacked gate flash memory cell may be applied to the patterning of any type feature, wherein the resultant feature has a width or feature size which is less than that which is possible using lithographic techniques. For example, in FIG. 14 a method 200 of forming a feature is provided. Initially, at 202 a first layer 204 is formed over a semiconductor substrate 206, for example, as illustrated in FIG. 15. A second layer 208 is then formed over the first layer 204 at 210 of FIG. 14, as illustrated in FIG. 16.

Figure 14:
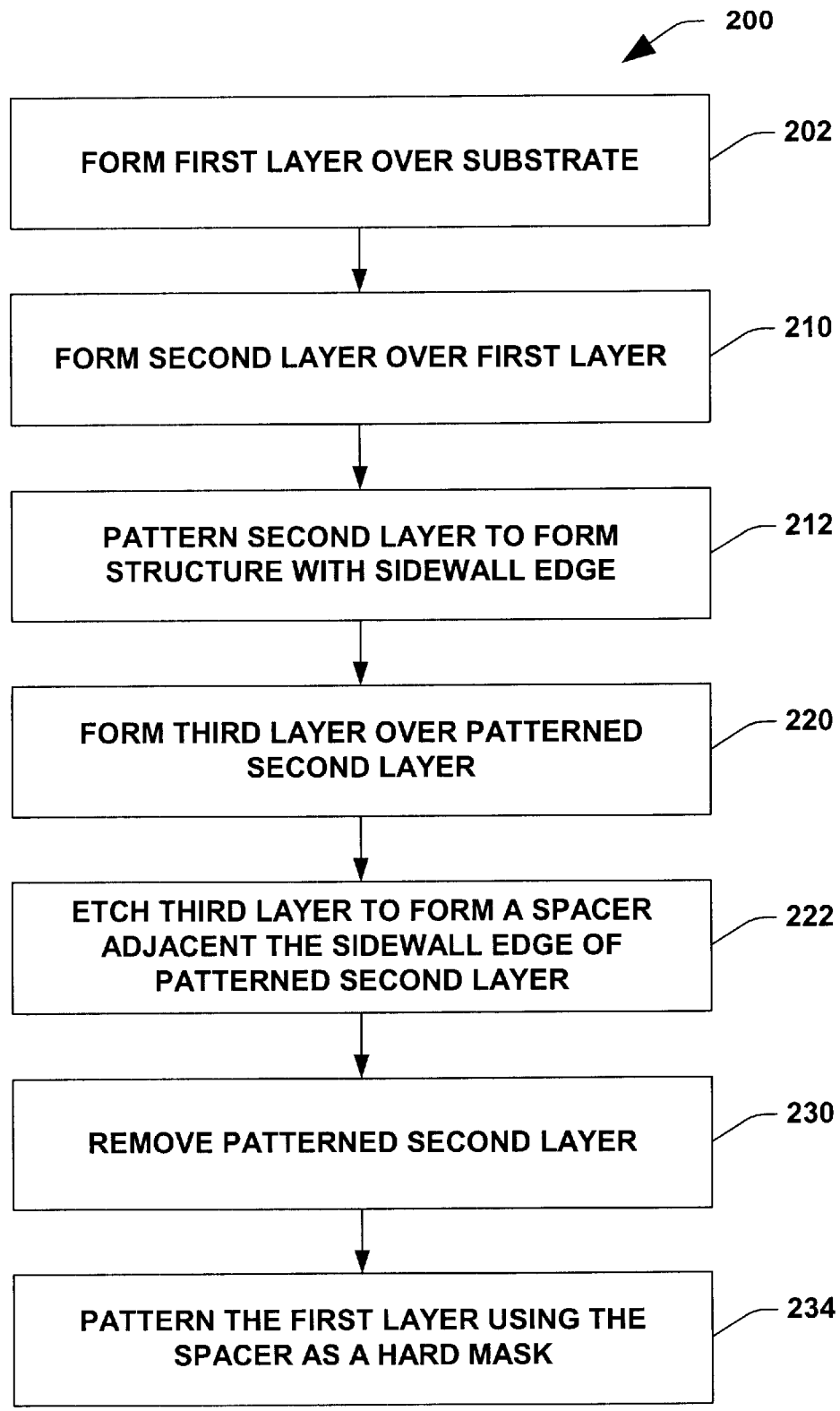
FIG. 14 is a flow chart illustrating a method of patterning a feature having a critical dimension that may be less than a capability of a lithography system in accordance with yet another aspect of the present invention.
Figure 17:
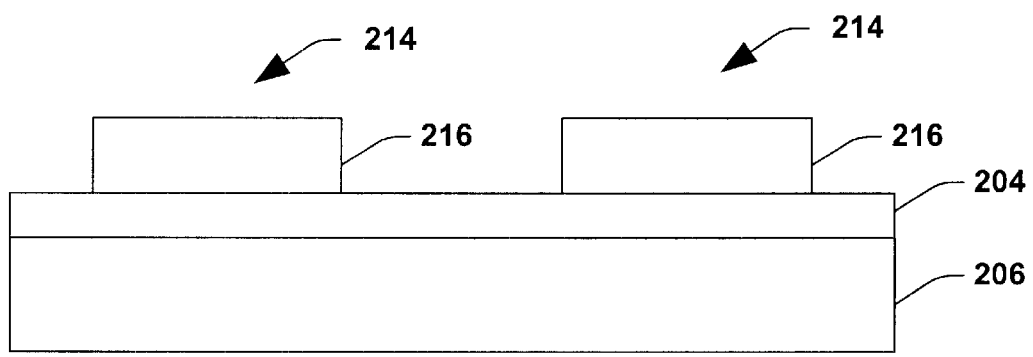
FIG. 17 is a cross section diagram illustrating a patterning of the second layer to form one or more structures having a lateral sidewall edge associated therewith in accordance with the present invention.
Figure 18:
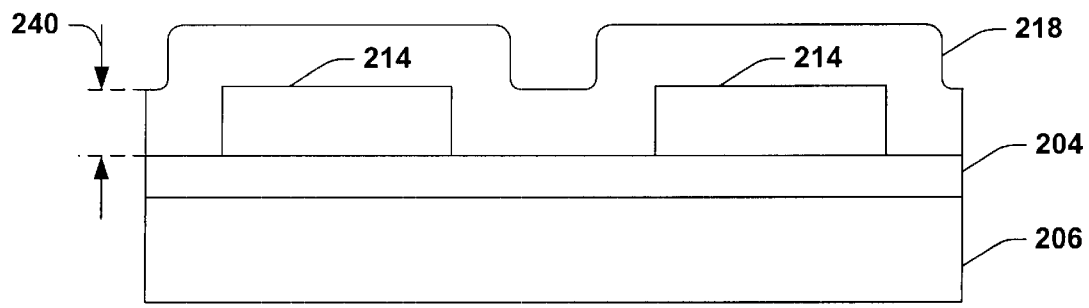
FIG. 18 is a cross section diagram illustrating a forming of a third layer over the patterned second layer in accordance with the present invention.
Figure 19:
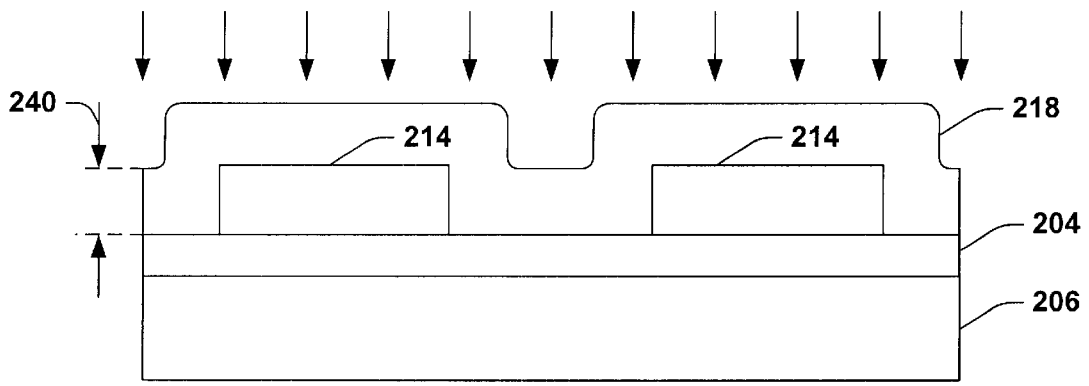
FIGS. 19 and 20 are a cross section diagrams illustrating a patterning of the third layer to form one or more sidewall spacers adjacent lateral sidewall edges of the patterned second layer features in accordance with the present invention.
Figure 20:
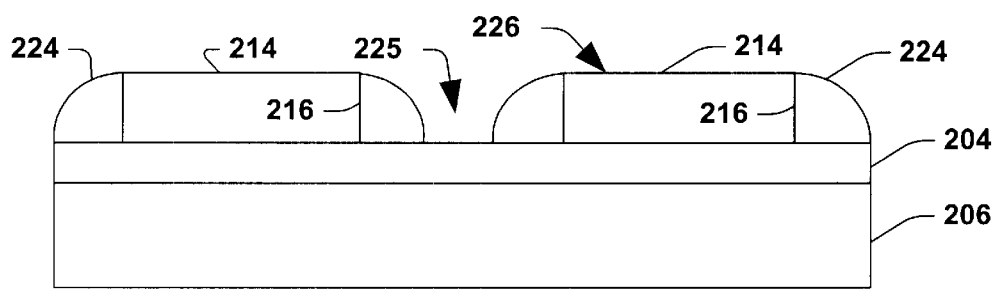

The method 200 of FIG. 14 continues at 212 with a patterning of the second layer 208 to form one or more structures 214 having a lateral sidewall edge 216 associated therewith, as illustrated in FIG. 17. A third layer 218 is then formed over the structures 214, for example, in a generally conformal manner at 220 of FIG. 14, as illustrated in FIG. 18. The third layer 218 is then etched at 222 to form a spacer 224 adjacent the lateral sidewall edge 216 of the patterned second layer 214, as illustrated in FIGS. 19 and 20. Such an etch process may comprise a generally anisotropic dry etch (e.g., a reactive ion etch (RIE)) which removes portions 225 of the third layer 218 which overlie directly the first layer 204 and a top portion 226 of the patterned features 214.

Figure 21:
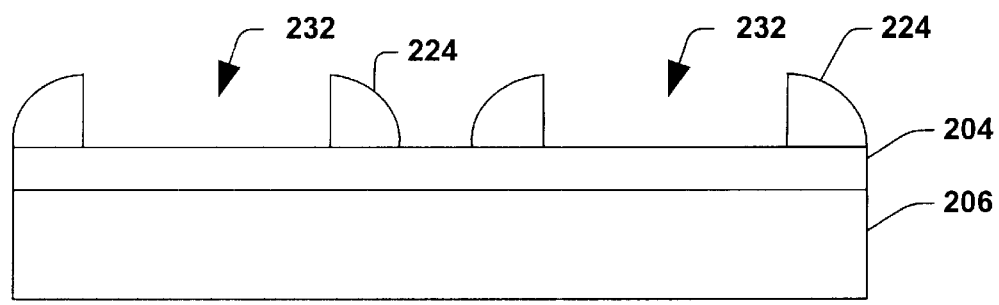
FIG. 21 is a cross section diagram illustrating a removal of the patterned second layer features, leaving the sidewall spacers overlying the first layer in accordance with the present invention.
Figure 22:
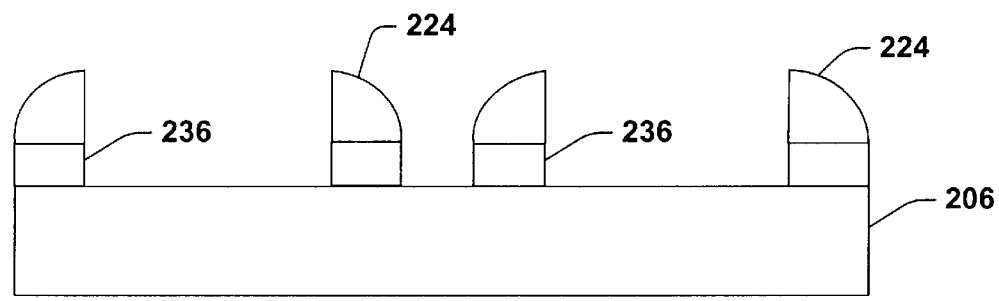
FIG. 22 is a cross section diagram illustrating a patterning of the first layer using the sidewall spacers as a hard mask in accordance with the present invention.
Figure 23:
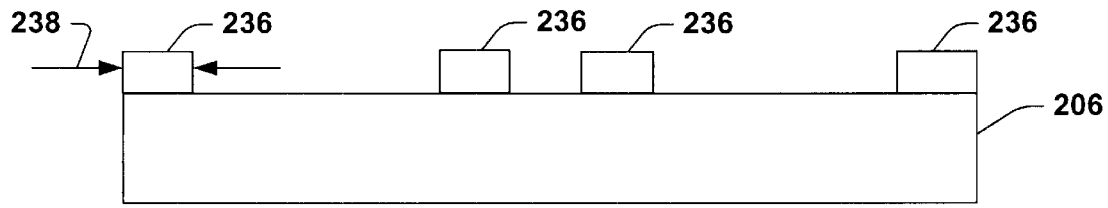
FIG. 23 is a cross section diagram illustrating a removal of the sidewall spacers, and exposing the patterned first layer structures having a critical dimension associated therewith that may be less than a feature size capability of a lithographic system in accordance with the present invention.

The patterned features 214 associated with the second layer are then removed at 230 of FIG. 14 to expose portions 232 of the underlying first layer 204, as illustrated in FIG. 21. The first layer 204 is then patterned at 234 of FIG. 14 using the spacer 224 as a hard mask to thereby form patterned first layer structures 236 under the spacers 224, as illustrated in FIG. 22. The method 200 then concludes with the removal of the spacers 224, thereby leaving the patterned first layer structures 236 overlying the substrate 206, as illustrated in FIG. 23. Note that a width 238 of the first layer structures 236 of FIG. 23 are a function of a thickness 240 of the third layer 218 which can be tailored to be substantially thin. Therefore the resultant thickness 238 of structures 236 may be formed to a dimension that is less than that provided by conventional lithographic processes.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a stacked gate flash memory cell, comprising:

forming a tunnel oxide layer, a floating gate polysilicon layer, an oxide-nitride-oxide layer, and a control gate polysilicon layer in succession over a semiconductor substrate;

forming an oxide sacrificial layer over the control gate polysilicon layer;

patterning an antireflective coating layer over the oxide sacrificial layer;

patterning the antireflective coating layer to form an antireflective coating feature having at least one lateral sidewall edge associated therewith;

forming a polysilicon spacer layer over the antireflective coating feature;

patterning the polysilicon spacer layer, thereby removing the spacer layer in a portion overlying the antireflective coating feature and in a portion overlying an exposed portion of the oxide sacrificial layer, and leaving a portion of the polysilicon spacer against the lateral sidewall edge of the antireflective coating layer, thereby defining a polysilicon sidewall spacer having a width associated therewith;

removing the antireflective coating feature;

patterning the oxide sacrificial layer using the spacer as a hard mask, thereby defining an oxide sacrificial hard mask structure underlying the spacer; and patterning the control gate polysilicon layer, the oxide-nitride-oxide layer and the floating gate polysilicon layer using the polysilicon spacer and the oxide sacrificial hard mask structure as a hard mask, thereby defining the stacked gate, wherein a width of the stacked gate is a function of the spacer width.

2. The method of claim 1, wherein the antireflective layer comprises one of a SiN and a SiON.

3. The method of claim 1, further comprising a source/drain implantation after defining the stacked gate, thereby forming source/drain regions in the semiconductor substrate which are substantially aligned with respect to the stacked gate.

4. The method of claim 1, wherein the width of the stacked gate is 100 nm or less.

* * * * *

UNITED STATES PATENT AND TRADEMARK OFFICE
CERTIFICATE OF CORRECTION

PATENT NO.   : 6,583,009 B1
DATED        : June 24, 2003
INVENTOR(S)  : Angela T. Hui et al.

It is certified that error appears in the above-identified patent and that said Letters Patent is hereby corrected as shown below:

Column 2,
Line 35, please replace the number "12" with the number -- 1-2 --.
Line 46, please replace the word "VS" with the word -- $V_S$ --.

Signed and Sealed this

Seventh Day of October, 2003

JAMES E. ROGAN
*Director of the United States Patent and Trademark Office*